(12) United States Patent
Zeng et al.

(10) Patent No.: US 7,535,689 B2
(45) Date of Patent: May 19, 2009

(54) REDUCING INPUT CAPACITANCE OF HIGH SPEED INTEGRATED CIRCUITS

(75) Inventors: Xiang Yin Zeng, Shanghai (CN); Ming Dong Cui, Shanghai (CN); Gregory V. Christensen, Lehi, UT (US); Mostafa Naguib Abdulla, Rancho Cordova, CA (US); Daoqiang Lu, Chandler, AZ (US); Jiangqi He, Gilbert, AZ (US); Jiamiao Tang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 112 days.

(21) Appl. No.: 11/821,005

(22) Filed: Jun. 21, 2007

(65) Prior Publication Data

US 2008/0316662 A1 Dec. 25, 2008

(51) Int. Cl.
*H02H 9/00* (2006.01)
*H02H 1/00* (2006.01)

(52) U.S. Cl. ........................................................ 361/56
(58) Field of Classification Search .................... 361/56
See application file for complete search history.

(56) References Cited

U.S. PATENT DOCUMENTS

| 6,016,000 A * | 1/2000 | Moslehi ..................... 257/522 |
| 6,560,862 B1 * | 5/2003 | Chen et al. .................... 29/843 |
| 7,148,575 B2 * | 12/2006 | Matsubara ................... 257/774 |
| 7,273,770 B2 * | 9/2007 | Edelstein et al. ............ 438/126 |
| 7,319,277 B2 * | 1/2008 | Lin ............................. 257/781 |
| 2002/0008325 A1 * | 1/2002 | Tominaga ................... 257/778 |
| 2003/0062581 A1 * | 4/2003 | Ahrens et al. .............. 257/430 |
| 2003/0074789 A1 * | 4/2003 | Chen et al. .................... 29/843 |

OTHER PUBLICATIONS

Reed, Hollie A., et al., "Compliant Wafer Level Package (CWLP) With Embedded Airgaps for Sea of Leads (SoL) Interconnections", *IEEE 2001*, (2001), 151-153.

* cited by examiner

*Primary Examiner*—Ronald W Leja
(74) *Attorney, Agent, or Firm*—Seth Z. Kalson

(57) ABSTRACT

An integrated circuit with reduced pad capacitance, having a trench formed in the silicon substrate below the pad to reduce the pad capacitance. In another embodiment, an encapsulated air cavity is formed underneath the pad.

8 Claims, 1 Drawing Sheet

REDUCING INPUT CAPACITANCE OF HIGH SPEED INTEGRATED CIRCUITS

FIELD

The present invention relates to semiconductor process technology, and more particularly, to reducing the pad capacitance of an integrated circuit.

BACKGROUND

For many integrated circuits, such as for example high-speed DDR (Double Data Rate) flash memory circuits, it is desirable to keep the input pin capacitance relatively small. Indeed, for some critical signals, such as the clock signal and the synchronous address advance signal, there are two on-die pads, further contributing to the total input capacitance for such signals. According to JEDEC, a semiconductor engineering standardization body of the EIA Electronic Industries Alliance, the clock signal input capacitance for a DDR flash memory chip should at least be less than 3.5 pF. This input capacitance also includes the contribution of the package trace capacitance. In current silicon semiconductor process design, a single pad capacitance may be as high as 1.2 pF, so that the input capacitance for the clock signal (assuming two pads) may be as high as 2.4 pF.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
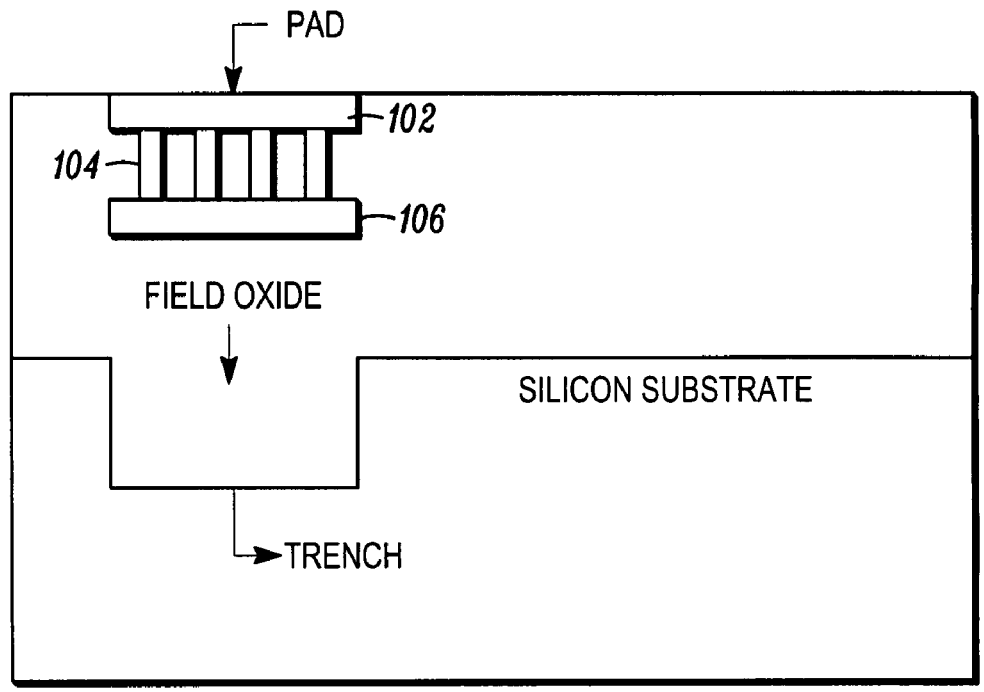
FIG. 1 illustrates a simplified view of a portion of an integrated circuit according to an embodiment of the present invention

FIG. 1 illustrates a simplified view of a portion of an integrated circuit according to an embodiment of the present invention. A pad is illustrated in FIG. 1, comprising a top metal layer, labeled as 102, connected to a lower metal layer, labeled as 106, by way of vias 104. Whereas in many prior art integrated circuits there would likely be electro-static discharge (ESD) circuits or devices placed under a pad, in the embodiment of FIG. 1, there are no ESD circuits or devices directly under the pad. In the embodiment of FIG. 1, a trench is formed directly under the pad, and a dielectric, such as a field oxide, for example, is formed between the pad and the substrate. The increased distance between the pad and the part of the silicon substrate directly under the pad decreases the capacitance when compared to the case in which there is no trench.

Figure 2:
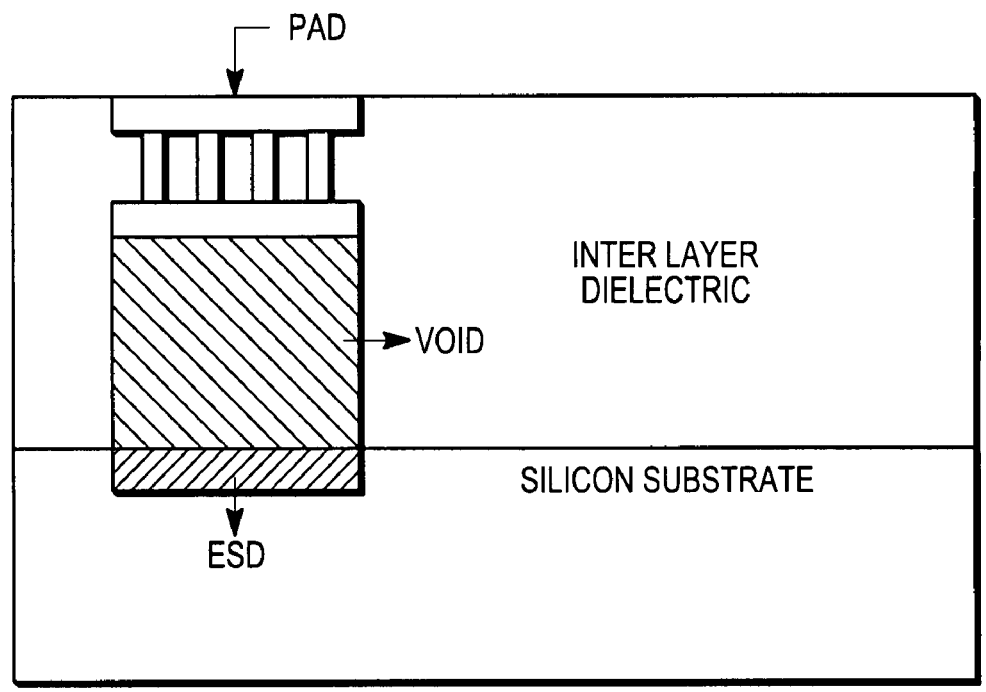
FIG. 2 illustrates a simplified view of a portion of an integrated circuit according to another embodiment of the present invention.

FIG. 2 illustrates a simplified view of a portion of an integrated circuit according to another embodiment of the present invention. Notice that in the particular embodiment displayed in FIG. 2, an ESD circuit is directly under the pad. This, however, is not a requirement of an embodiment, but merely serves to illustrate that the embodiments illustrated by FIG. 2 are well suited to those integrated circuits in which it is desired to place an ESD circuit under a pad.

Between the pad and the silicon substrate, or ESD circuit, directly under the pad, there is a void in the interlayer dielectric. This void may be filled with air or some other gas if the integrated circuit is deployed in an environment without air. This void may be referred to as an encapsulated air cavity, and has a dielectric constant less than that of the interlayer dielectric. For example, the dielectric constant of air may be about one fourth that of the interlayer dielectric, so that there may be a reduction in pad capacitance of approximately 75%. Consequently, the capacitance of the pad is reduced when compared to the case in which there is no void in the interlayer dielectric.

One method for fabricating the embodiment of FIG. 2 is to introduce a sacrificial material to replace the interlayer dielectric material under the pad area during the fabrication process. The sacrificial material is chosen to decompose completely into gases in post silicon processing, or in the package processing. After the sacrificial material has escaped, an air cavity is created under the pad. For some embodiments, a photo-definable polymer sacrificial material may be used. One such example of a sacrificial material is Unity 2203P from Promerus, LLC, a Delaware corporation with headquarters at 9921 Brecksville Road, Brecksville, Ohio.

Various modifications may be made to the described embodiments without departing from the scope of the invention as claimed below.

What is claimed is:

1. An integrated circuit comprising:
   an input pin;
   a pad connected to the input pin, the pad comprising a top metal layer and a bottom metal layer, and comprising at least one via to electrically connect the bottom metal layer to the top metal layer;
   a silicon substrate having a trench formed directly underneath the bottom metal layer of the pad; and
   a dielectric formed in the trench and adjacent to the bottom metal layer of the pad.

2. The integrated circuit as set forth in claim 1, wherein the dielectric is a field oxide.

3. The integrated circuit as set forth in claim 1, wherein the trench and the bottom metal layer are laterally coextensive.

4. An integrated circuit comprising:
   an input pin;
   a pad connected to the input pin, the pad comprising a top metal layer and a bottom metal layer, and comprising at least one via to electrically connect the bottom metal layer to the top metal layer;
   a silicon substrate; and
   an interlayer dielectric having an encapsulated air cavity directly underneath the bottom metal layer of the pad, so that the bottom metal layer of the pad is adjacent to a top portion of the encapsulated air cavity, and the silicon substrate is adjacent to a bottom portion of the encapsulated air cavity.

5. The integrated circuit as set forth in claim 4, wherein encapsulated air cavity and the bottom metal layer are laterally coextensive.

6. The integrated circuit as set forth in claim 4, the silicon substrate having an electro-static discharge circuit formed thereon, directly under the encapsulated air cavity.

7. The integrated circuit as set forth in claim 4, wherein the encapsulated air cavity has a first dielectric constant, and the interlayer dielectric has a second dielectric constant greater than the first dielectric constant.

8. The integrated circuit as set forth in claim 7, the silicon substrate having an electro-static discharge circuit formed thereon, directly under the encapsulated air cavity.

* * * * *